(12) United States Patent
Watanabe et al.

(10) Patent No.: US 10,491,154 B2
(45) Date of Patent: Nov. 26, 2019

(54) SOLAR POWER GENERATION EXAMINATION SYSTEM AND SOLAR POWER GENERATION EXAMINATION METHOD

(71) Applicant: Hitachi Systems, Ltd., Tokyo (JP)

(72) Inventors: Kazuki Watanabe, Tokyo (JP); Hironori Wakana, Tokyo (JP); Yoshihito Narita, Tokyo (JP); Minoru Kaneko, Tokyo (JP); Atsushi Suzuki, Tokyo (JP); Tadanori Koike, Tokyo (JP); Keiichi Nagashima, Tokyo (JP)

(73) Assignee: HITACHI SYSTEMS, LTD, Tokyo (JP)

(*) Notice: Subject to any disclaimer, the term of this patent is extended or adjusted under 35 U.S.C. 154(b) by 81 days.

(21) Appl. No.: 15/742,888

(22) PCT Filed: Jul. 10, 2015

(86) PCT No.: PCT/JP2015/069870
§ 371 (c)(1),
(2) Date: Jan. 9, 2018

(87) PCT Pub. No.: WO2017/009892
PCT Pub. Date: Jan. 19, 2017

(65) Prior Publication Data
US 2018/0198405 A1 Jul. 12, 2018

(51) Int. Cl.
*H02S 50/10* (2014.01)
*H02S 50/00* (2014.01)
*G01R 19/10* (2006.01)

(52) U.S. Cl.
CPC .............. *H02S 50/10* (2014.12); *G01R 19/10* (2013.01); *H02S 50/00* (2013.01)

(58) Field of Classification Search
CPC ...................................................... H02S 50/10
See application file for complete search history.

(56) References Cited

U.S. PATENT DOCUMENTS

| 5,955,885 A | * | 9/1999 | Kurokami | .............. G01R 31/40 136/243 |
| 2003/0063008 A1 | * | 4/2003 | Kobayashi | .............. H02S 50/10 340/635 |

(Continued)

FOREIGN PATENT DOCUMENTS

| JP | 2009021341 A | 1/2009 |
| JP | 2011029541 A | 2/2011 |

(Continued)

*Primary Examiner* — Clayton E. LaBalle
*Assistant Examiner* — Jas A Sanghera
(74) *Attorney, Agent, or Firm* — Soroker Agmon Nordman (57) ABSTRACT

A defective photovoltaic cell module is identified without disconnection in a photovoltaic cell string. As a typical embodiment, in a photovoltaic power generation inspection system in a photovoltaic power generation system having a structure in which a plurality of photovoltaic cell strings are connected in parallel, the photovoltaic power generation system detecting a defective module among a plurality of modules included in a defective string, the photovoltaic power generation inspection system includes: a current detector that measures an output current of a photovoltaic cell string without disconnection; and a monitor unit that estimates a defective module based on change in a plurality of output currents each measured by the current detector while the photovoltaic cell modules included in the defective string are sequentially shielded from light by a light shielding member.

10 Claims, 8 Drawing Sheets

(56) References Cited

U.S. PATENT DOCUMENTS

| | | |
|---|---|---|
| 2015/0094967 A1 | 4/2015 | Kouno et al. |
| 2016/0218668 A1 | 7/2016 | Kono et al. |

FOREIGN PATENT DOCUMENTS

| | | |
|---|---|---|
| JP | 2013138133 A | 7/2013 |
| JP | 2014165277 A | 9/2014 |
| JP | 2015068690 A | 4/2015 |
| JP | 2015080399 A | 4/2015 |
| JP | 2015103718 A | 6/2015 |
| WO | 2015022728 A1 | 2/2015 |

* cited by examiner

SOLAR POWER GENERATION EXAMINATION SYSTEM AND SOLAR POWER GENERATION EXAMINATION METHOD

TECHNICAL FIELD

The present invention relates to a photovoltaic power generation technique, and, more particularly, the present invention relates to a technique effectively applied to a photovoltaic power generation inspection system and a photovoltaic power generation inspection method detecting a defect of a photovoltaic cell module.

BACKGROUND ART

In Japan, a market of large-scale photovoltaic power generation systems such as a mega-solar power plant having an output of one megawatt or larger has been expanded by introduction of FIT (Feed-in Tariffs). Meanwhile, it is also considered that a market of maintenance such as detection and diagnosis of defects of the already-structured and operating photovoltaic power generation systems will be further expanded in the future.

Various techniques related to the detection and the diagnosis of the defects of the photovoltaic power generation systems, the photovoltaic cell modules, and others have been already suggested. For example, Japanese Patent Application Laid-Open Publication No, 2009-21341 (Patent Document 1) describes a technique of identifying a defective position in a photovoltaic cell array and a defective type by applying a measurement signal waveform to a part between a ground terminal and a terminal (positive electrode or negative electrode) of a photovoltaic cell string or a terminal (positive electrode or negative electrode) of a photovoltaic cell array and comparing the measurement signal waveform with a response signal waveform.

And, Japanese Patent Application Laid-Open Publication No. 2011-29541 (Patent Document 2) describes a technique in which a photovoltaic cell module has a plurality of photovoltaic cell panels and a movable member that is movable for shielding from at least a part of incident light that enters the plurality of photovoltaic cell panels, the technique diagnosing an operation state of each of the plurality of photovoltaic cell panels based on a moving state of the movable member.

And, International Publication WO/2015/022728 (Patent Document 3) describes a technique of measuring each of a first output current of a first photovoltaic cell string and a second output current of a second photovoltaic cell string, calculating a second temperature property of the second photovoltaic cell string based on a value of the first output current and a valine of the second output current, and determining whether the second photovoltaic cell string has a defective or not based on the second temperature property.

RELATED ART DOCUMENTS

Patent Documents

Patent Document 1: Japanese Patent Application Laid-open Publication No. 2009-21341
Patent Document 2: Japanese Patent Application Laid-Open Publication No. 2011-29541
Patent Document 3: International Publication WO/2015/022728

SUMMARY OF THE INVENTION

Problems to be Solved by the Invention

For example, by using the technique described in the Patent Document 1, the defective position or others in the photovoltaic cell array or the photovoltaic cell string can be identified without detaching the photovoltaic cell module. However, in this case, disconnection is required in order to apply a measurement signal to a part between a ground terminal and a terminal of the photovoltaic cell array or the photovoltaic cell string to measure a response signal. Therefore, at the disconnection, power loss is caused since there is a photovoltaic cell string or others that is disconnected from the system. Thus, this particularly largely affects small- and middle-scale power generation facilities. Further, a work load increases, and this particularly largely affects large-scale facilities.

In the technique described in the Patent Document 2, the operational state of each of the plurality of photovoltaic cell panels is diagnosed by relatively comparing the outputs of the plurality of photovoltaic cell panels while shielding some photovoltaic cell panels from light by the movable member, and therefore, the diagnosis can be made regardless of a light source state, a positional relation between the light source and the photovoltaic cell panel, and others. However, in this case, it is required to detect the output of each of the photovoltaic cell panels, and the technique cannot be applied to, for example, a structure in which a large number of photovoltaic cell panels are connected in series such as a power generation facility since it is difficult to individually detect the output of each of the photovoltaic cell panels.

Meanwhile, by using the technique described in the Patent Document 3, the photovoltaic cell string having the defect can be identified without requiring the disconnection. However, it cannot be further identified which one of the plurality of photovoltaic cell modules included in the photovoltaic cell string is defective.

Accordingly, an object of the present invention is to provide a photovoltaic power generation inspection system and a photovoltaic power generation inspection method for identifying a defective photovoltaic cell module without requiring disconnection in a photovoltaic cell string that is structured by connecting a plurality of photovoltaic cell modules in series.

The above and other object and novel characteristics of the present invention will be apparent from the description of the present specification and the accompanying drawings.

Means for Solving the Problems

The summary of the typical aspects of the inventions disclosed in the present application will be briefly described as follows.

A photovoltaic power generation inspection system according to a typical embodiment of the present invention is a photovoltaic power generation inspection system in a photovoltaic power generation system having a structure in which a plurality of photovoltaic cell strings each formed of a plurality of series-connected photovoltaic cell modules are connected in parallel, the photovoltaic power generation inspection system detecting a defective module that is a photovoltaic cell module having a defect among the plurality of photovoltaic cell modules included in a defective string that is a photovoltaic cell string identified as having the defect. And, the photovoltaic power generation inspection system has the following features.

That is, the photovoltaic power generation inspection system has: a current detector that measures an output current of a photovoltaic cell string without disconnection; and a monitor unit that estimates one or more defective modules described above based on change in a plurality of first output currents each measured by the current detector while the photovoltaic cell modules included in the defective string are sequentially shielded from light by a light shielding member.

Effects of the Invention

The effects obtained by the typical aspects of the present invention disclosed in the present, application will be briefly described below.

That is, according to a typical embodiment of the present invention, in a photovoltaic cell string structured by connecting a plurality of photovoltaic cell modules in series, a defective photovoltaic cell module can be identified without requiring disconnection.

BRIEF DESCRIPTIONS OF THE DRAWINGS

FIGS. 3(a) and (b) are diagrams illustrating an outline of an example of module property change caused by a layout of the light shielding plate or a defect according to one embodiment of the present invention;

BEST MODE FOR CARRYING OUT THE INVENTION

Hereinafter, embodiments of the present invention will be described in detail based on the accompanying drawings. Note that the same components are denoted by the same reference symbols throughout all the drawings for describing the embodiments in principle, and the repetitive description thereof will be omitted. Meanwhile, a portion described with a reference symbol in a certain drawing is not illustrated again in the description for other drawings, but is described with the same reference symbol in some cases.

<Outline>

By using, for example, the related art technique as described in the Patent Document 3, in a photovoltaic cell string that is previously identified as having a defect, a photovoltaic power generation inspection system according to one embodiment of the present invention identifies a defective one of a plurality of photovoltaic cell modules included in the photovoltaic cell string without further requiring disconnection.

Specifically, a defective photovoltaic cell module is estimated by using a method described later that measures an output current of a target photovoltaic cell string while a light shielding plate is set at a specific photovoltaic cell module in the target photovoltaic cell string and observing change in the output current caused when the light shielding plate is sequentially moved to another photovoltaic cell module. In the present embodiment, a value (a change amount of the output current) that becomes criteria for estimating a defective photovoltaic cell module or a total number of the defective photovoltaic cell modules is obtained by forming a determinate constructive defective state by using the light shielding plate, and therefore, estimation accuracy can be improved.

<System Structure>

Figure 1:
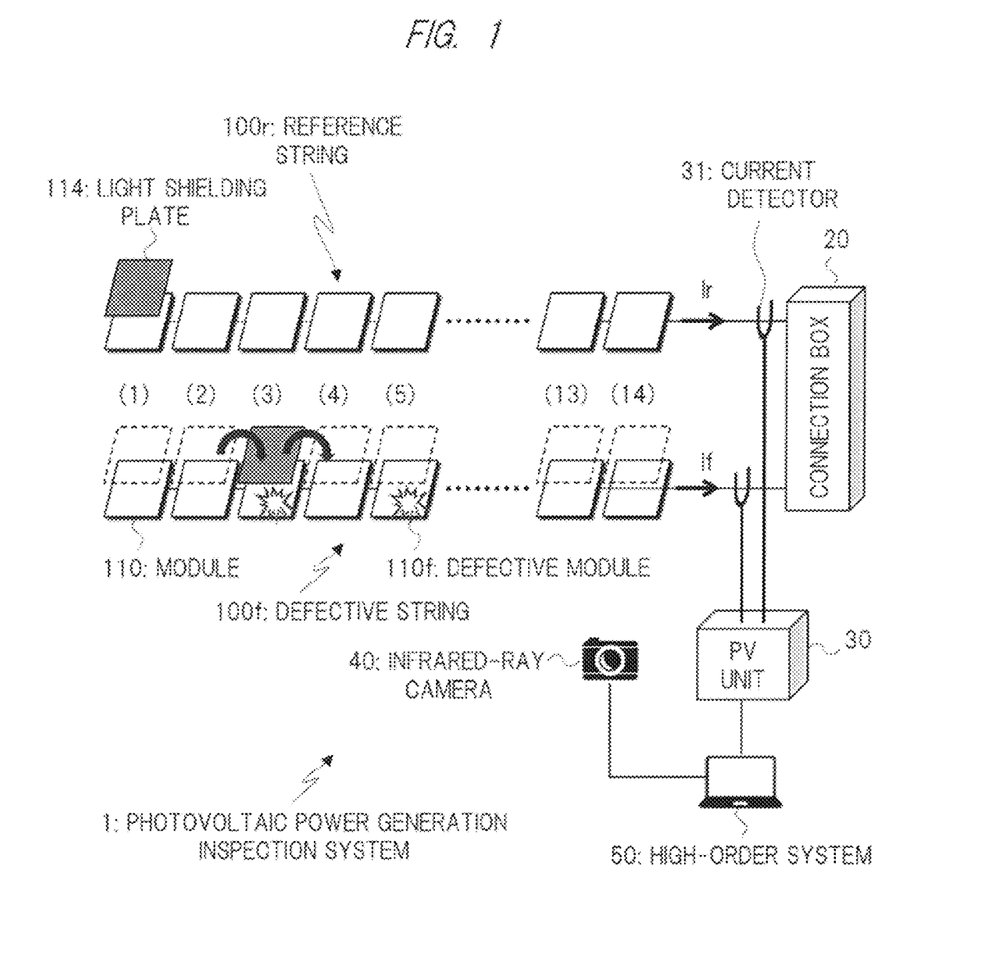
FIG. 1 is a diagram illustrating an outline of a structure example of a photovoltaic power generation inspection system according to one embodiment of the present invention.

FIG. 1 is a diagram illustrating an outline of a structure example of a photovoltaic power generation inspection system according to one embodiment of the present invention. The present embodiment has a structure for, simultaneously in parallel (at the same time), measuring an output current "Ir" of a reference string 100r selected based on predetermined criteria from normal strings of a plurality of photovoltaic cell strings that are connected in parallel through a wiring in a connection box 20 of a photovoltaic power generation system and measuring an output current. "If" of a defective string 100f that is an inspection target identified as having the defect, by using a current detector 31 connected to a PV (Photovoltaic) unit 30 or others.

The current detector 31 can be structured by using, for example, a clamp-type ammeter such as a general CT (Current Transformer) sensor, and can measure a current in a contact less state without requiring such an operation as opening and connecting a wiring path from each of the photovoltaic cell strings.

Not only the contact less measurement but also other methods may be applicable as long as the method can perform the measurement without the stop and the disconnection. For example, such a method as previously inserting a sensor for measuring a current or others into a wiring path of each string may be applicable. By the parallel measurement of the output current Ir of the reference string 100r and the output current If of the defective string 100f at the same timing, errors caused by environmental change such as a solar radiation amount and a temperature in a case of different measurement timing can be suppressed as described later.

The data of the output current Ir and If obtained in the PV unit 30 is transmitted to a high-order system 50 (monitor unit) formed of, for example, an information processing device such as a PC (Personal Computer). Regarding the data transmission, the data may be transmitted through a wired/wireless network, or may be passed through an external storage medium such as a semiconductor memory device. The high-order system 50 performs an analysis by using a method described later using a software or others operating on a middleware such as an OS (Operating System) not illustrated, and estimates one or more defective modules 110f in the defective string 110f. This software may operate on not the high-order system 50 but a server system that is accessible through a network not illustrated.

And, the high-order system 50 obtains an image-capturing data of each of a front surface and a back surface of each module 110 in the defective string 100$f$ whose image has been captured by an infrared-ray camera 40 similarly through a wired/wireless network or an external storage medium. Since a defective portion generally strongly tends to generate heat to a high temperature, it is automatically or manually checked whether a heat-generated portion (hot spot) exists or not based on the image data obtained by the infrared-ray camera 40, so that the determination can be also used as additional information in the estimation for the presence or absence of the defect. Note that the hot spot is assumed to be used as reference information or additional information since the hot spot may be caused in not only the defective case but also, for example, a case with adhesion of obstacles such as dusts and dirt.

In the present embodiment, as described above, the output currents Ir and If are measured while a constructive defective state is formed by setting the light shielding plate 114 at each module 110 of the reference string 100$r$ and the defective string 110$f$. Although described in detail later, the output current Ir measured while setting the light shielding plate 114 at any module 110 in the reference string 100$r$ is specifically used as calculation criteria in the estimation of the presence or absence of the defect and the total defective number. Regarding the defective string 100$f$, the defective string 100$f$ is identified by measuring the output current If while sequentially moving the light shielding plate 114 over the modules 110 including the defective module 110$f$ and observing change in the output currents.

In the present embodiment, note that it is assumed that the defective string 100$f$ is previously identified. For the identification, for example, the technique as described in the Patent Document 3 can be used. In this case, the photovoltaic power generation inspection system described in the Patent Document 3 and the photovoltaic power generation inspection system described in the present embodiment can be also integrated together as one system. In this manner, an inspection for identifying the defective string 100$f$ among the plurality of photovoltaic cell strings and an inspection for identifying the defective module 100$f$ in the defective string 100$f$ can be also seamlessly performed by one inspection system.

<Basic Concept and Principle>

Figure 2:
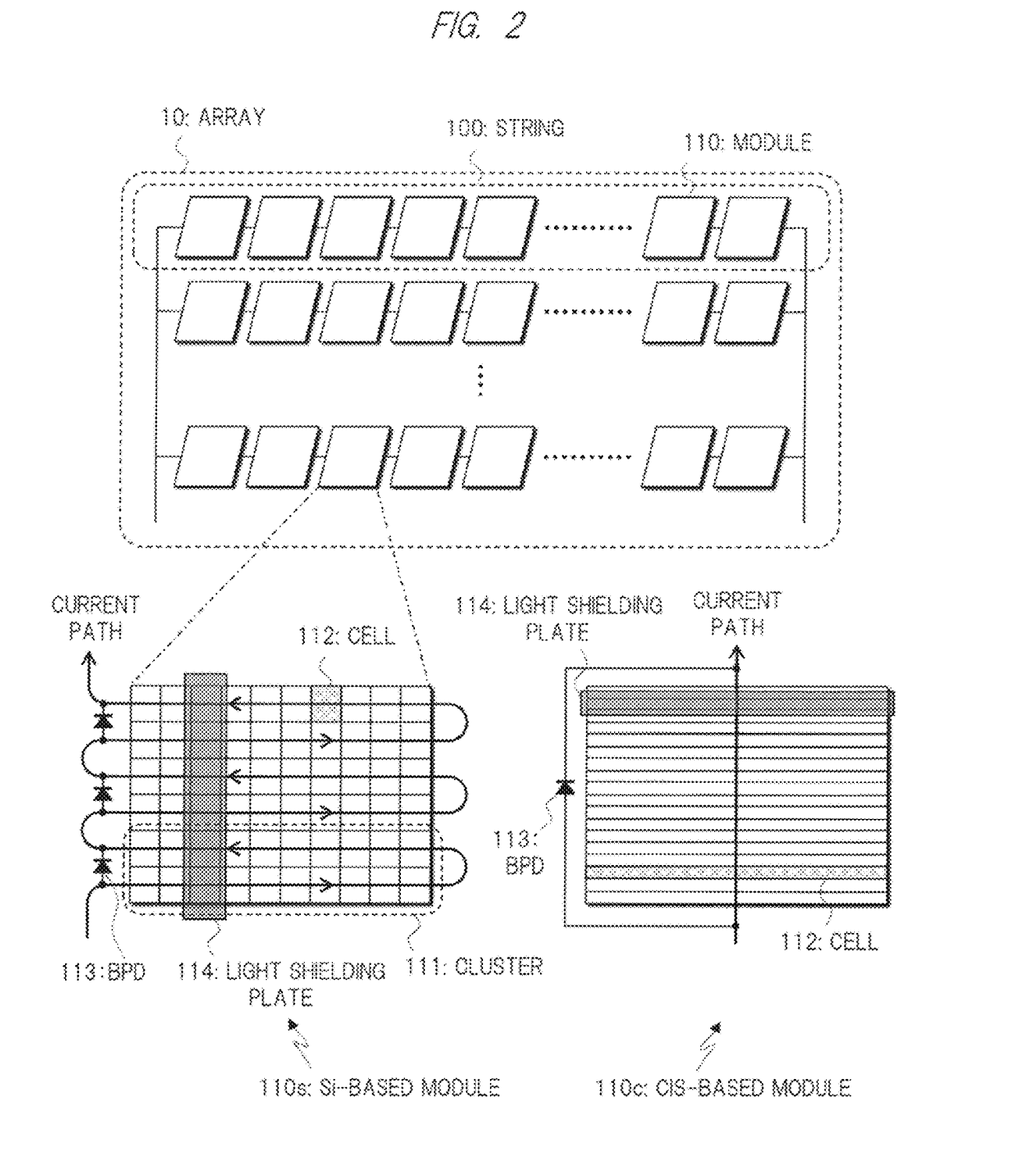
FIG. 2 is a diagram illustrating an outline of a structure example and a light shielding method of a photovoltaic power generation system according to one embodiment of the present invention.

FIG. 2 is a diagram illustrating an outline of a structure example and a light shielding method of the photovoltaic power generation system according to the present embodiment. The photovoltaic power generation system according to the present embodiment is the same as a general photovoltaic power generation system, and has a structure in which, for example, two or more photovoltaic cell strings (the string 100 in the drawing) are connected in parallel through a wire connection in a connection box not illustrated, the photovoltaic cell string being obtained by connecting a plurality of (14 in the present embodiment) photovoltaic cell modules (the module 110 in the drawing) in series, as illustrated in an upper drawing. A photovoltaic cell array (the array 10 in the drawing) may be structured by arranging the plurality of strings 100 that are connected in parallel, and the connection box may be provided to each array 10.

And, they are further collected and connected to a power system through a DC/DC converter and inverter or a PCS (Power Conditioning System) including the converter and the inverter not illustrated. In this manner, a power generated by each string 100 can be output to the power system.

A lower drawing in FIG. 2 illustrates an outline of a structure example of the module 110. A left drawing illustrates a structure example of a Si (silicon)-based module 110$s$, and a right drawing illustrates a structure example of a CIS (Copper, Indium, and Selenium)-based module 110$c$. Although both of the Si-based module 110$s$ and the CIS-based module 110$c$ are structured by series connection of cells 112 each formed of a semiconductor element or others that converts the solar light into the power, they are different from each other in a layout of the cells and a portion to which a bypass diode (BPD) 113 is inserted. Note that the BPD 113 is normally set in the module 110 in order to secure a current path when the defective cell 112 is caused.

In the Si-based module 110$s$, the cells 112 on the lattice layout are connected in series so as to form a current path that runs as a round trip from as illustrated, and the BPDs 113 are connected in parallel in terms of one round. And, a group of the cells 112 included in this one-round current path is assumed to be a cluster 111. That is, the BPDs 113 are connected in parallel for each cluster 111. When the defect is caused at the cell 112 in the cluster 111, the BPDs 113 corresponding to this cluster 111 becomes the current path, and only this cluster 111 is excluded, so that an area of influences is limited, and availability is enhanced.

Note that it is assumed that the Si-based module 110$s$ according to the present embodiment has three clusters 111, and note that one cluster 111 has ten cells 112 for each one way of the round. That is, one cluster 111 is formed of twenty cells 112 expressed as "10 (columns)×2 (rows)=20", and one Si-based module 110$s$ is formed of sixty cells 112 expressed as "20 (cells)×3 (clusters)=60". Since the number of the clusters 111 is three, this module also has three BPDs 113.

When the constructive defective state is formed by setting the light shielding plate 114 at such Si-based module 110$s$, the light shielding plate is set so as to, for example, cover at least the cells 112 on one or more columns over all clusters 111 across the Si-based module 110$s$ in a direction (column direction) crossing a direction of the current path as illustrated. In this manner, by setting the light shielding plate 114, all of the three clusters 111 have the cell 112 (two cells 112 per one cluster 111 in the example of FIG. 2) whose state is equivalent to the defective state, and therefore, have the current path formed through the BPD 113.

Note that the method of setting the light shielding plate 114 is not limited to this method as long as each state of the three clusters 111 can be equivalent to the defective state. For example, a position at which the light shielding plate 114 is set can be appropriately decided so as to, for example, cover the entire cells 112 on one column that is the closest to a left/right end in consideration of operator's convenience for a setting work or others. And, in the example of FIG. 2, it is also assumed that the light shielding plate 114 has a width that covers the entire cells 112 on one column. However, it may have a width that covers the cells 112 on two or more columns, or that covers the entire module 110. Alternatively, a plurality of light shielding plates 114 may be used. And, this method is not limited to be used in a case of manual setting by the operator or others, and this method may provide, for example, a system that automatically moves the light shielding plate 114.

Meanwhile, the light shielding plate 114 can be also structured so as to cover not all the three clusters 111 but a part of the clusters 111 such as one or two clusters. In this case, it is logically possible to identify the presence or absence of the defect in terms of not the module 110 but the cluster 111. However, this case increases a work amount for the inspection, and besides, for example, when the defect is caused in one cluster 111, maintenance such as replacement or repair is performed in terms of not the cluster 111 but the module 110. Therefore, in the present embodiment, it is assumed that the constructive defective state is formed at the entire module 110 by setting the light shielding plate 114 at sill the three clusters 111.

The CIS-based module 110c illustrated in a lower right drawing of FIG. 2 has a structure in which belt-arranged cells 112 are connected in series so as to form one-directional current path as illustrated, and one BPD 113 is connected in parallel as a whole. In this case, in order to form the constructive defective state at the module 110, the light shielding plate 114 is set so as to, for example, cover at least one or more (two in the example of FIG. 2) entire cells 112 as illustrated. As similar to the case of the Si-based module 110s, the method of setting the light shielding plate 114 is not limited to the illustrated method.

Note that the following is explanation in an assumption that the Si-based module 110s is used as the string 100. However, the explanation is similarly applicable also to a case of usage of the CIS-based module 110c in an assumption with only one cluster 111.

Figure 3:
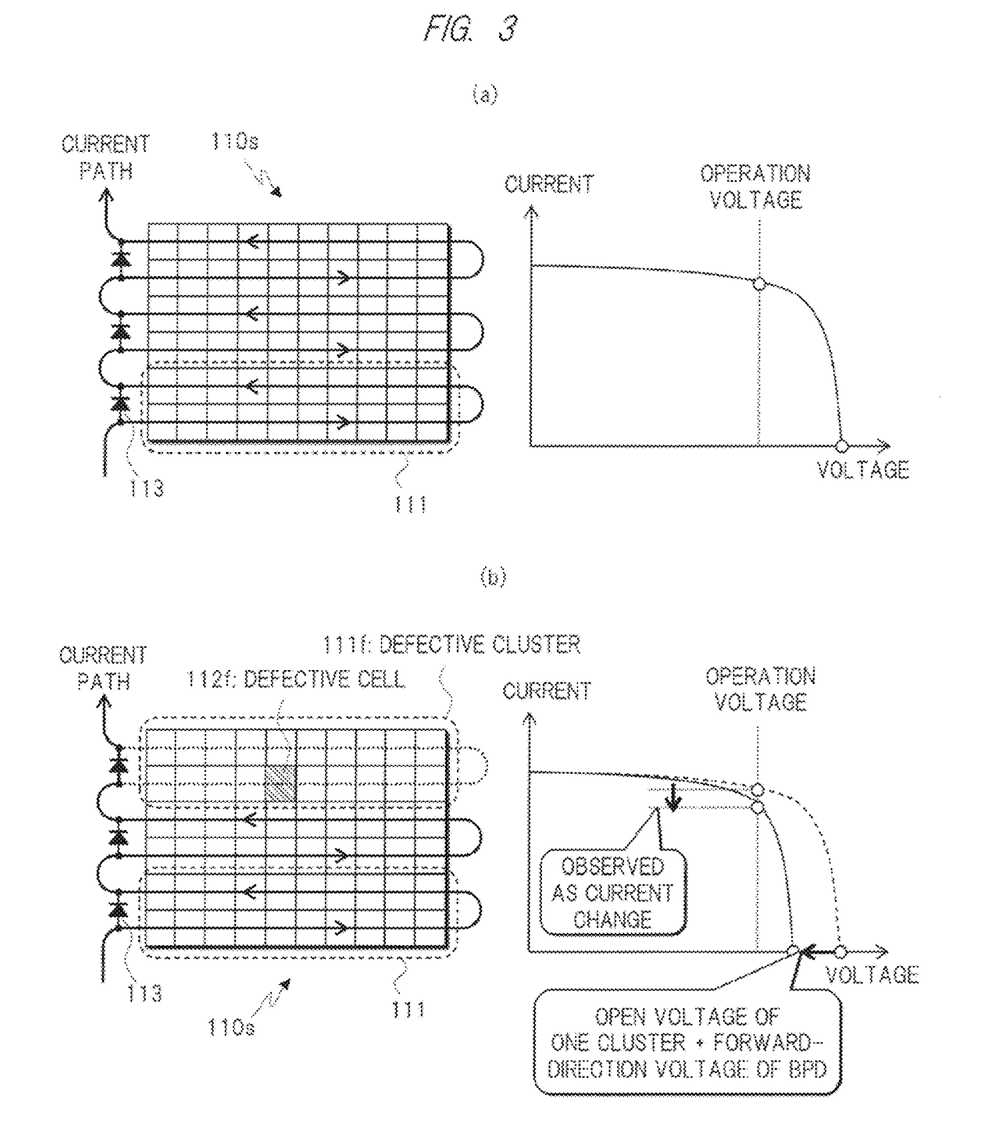

FIG. 3 is a diagram illustrating an outline of an example of a layout of the light shielding plate 114 or a property change in the module 110 due to the defect according to the present embodiment. FIG. 3(a) illustrates an example of a normal Si-based module 110s without the defective cell 112 and an operation property of the Si-based module 210s as illustrated in FIG. 3(b). The Si-based module 110s has a current—voltage property as illustrated in a right diagram under such a circumstance that there is no defective cell 112f as illustrated in a left drawing, which results in formation of a current path at all the three clusters 111 so as not to run through the BPD 113. An operational voltage is controlled by a system or others that controls the photovoltaic power generation system so that the maximum power can be obtained.

FIG. 3(b) illustrates an example of the Si-based module 110s having the defective cell 112f (that is, the defective module 110f in FIG. 1) and an operational property of the Si-based module 110s. When there is the defective cell 112f (one defective cell in the example of FIG. 3) as illustrated in a left drawing, the defective cluster 111f (one defective cluster in the example of FIG. 3) including this defective cell is excluded, and a current path running through the BPD 113 is formed. In this case, in a current-voltage property of the Si-based module 110s as illustrated in a right drawing, the output voltage is reduced by a sum of an open voltage corresponding to one cluster 111 and a forward-directional voltage corresponding to one BPD 113.

At this time, if it is assumed that the operational voltage is controlled so as to be the same as a voltage at a normal time as illustrated in FIG. 3(a), the output current is reduced as illustrated. In the present embodiment, by observing change in this output current, it is estimated whether the defective cluster 111f exists or not. If there is still another defective cluster 111f, the reduction in the output voltage in the current-voltage property becomes larger as the number of the defective clusters is larger, which results in larger reduction in the output current. Therefore, based on how much the observed output current is reduced, not only the presence or absence of the defective cluster 111f but also the number of the defective clusters can be estimated.

Strictly speaking, if there is the defective cluster 111f, note that a value of the operational voltage can also change. However, under environment of, for example, a large-scale facility such as a mega solar plant in which a large number of modules 110 are connected in series, influence on the operational voltage is extremely small as a whole. Therefore, also in consideration of convenience for calculation and others, in the present embodiment, the operational voltage is handled so as not to be different from that in a case in which the inspection-target defective module 100f is in a normal state.

<Method of Identifying Defective Modules>

Figure 4:
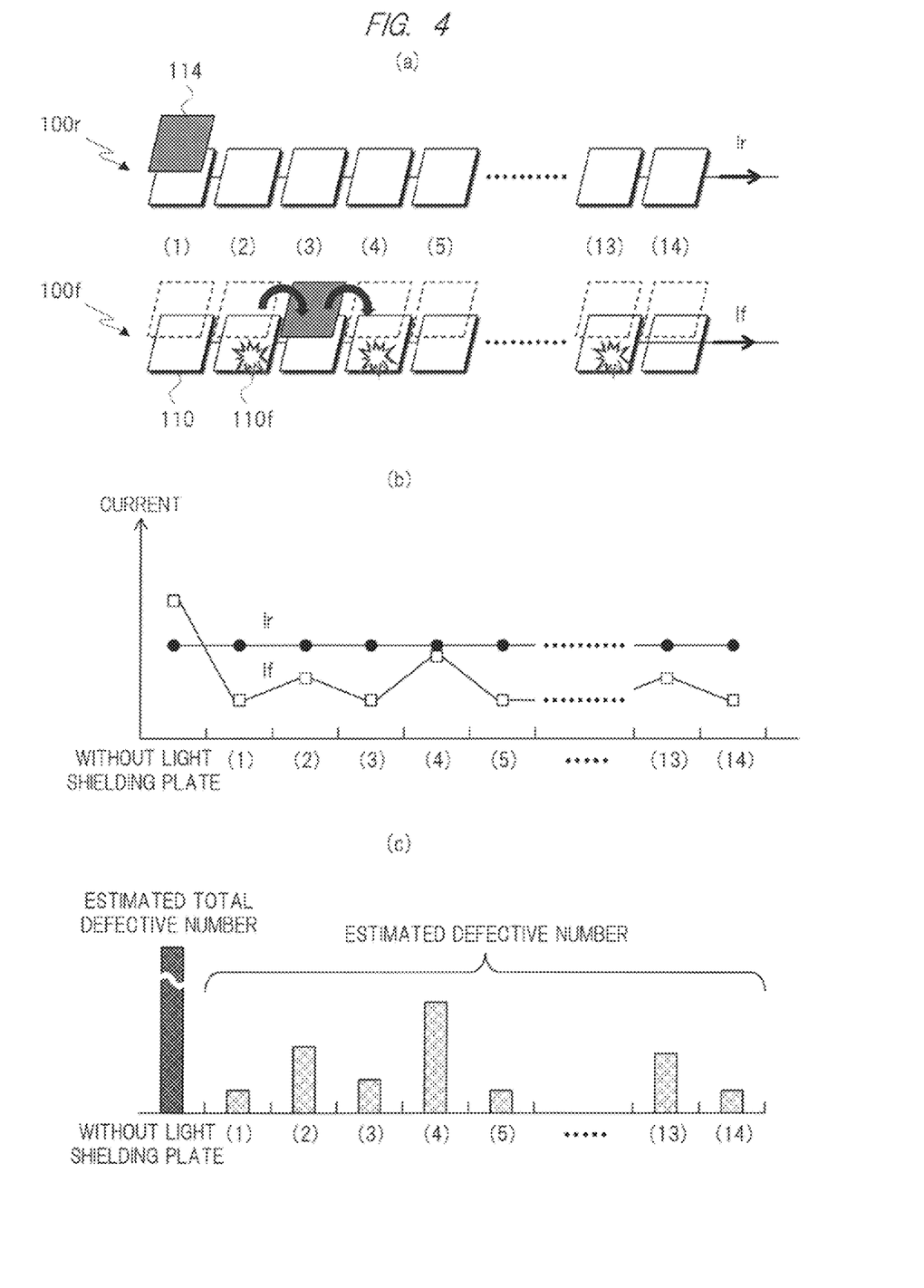
FIGS. 4(a) to (c) are diagrams illustrating an outline of an example of a method of identifying a defective module according to one embodiment of the present invention.

FIG. 4 is a diagram illustrating an outline of an example of a method of identifying the detective module 110f according to the present embodiment. FIG. 4(a) illustrates the reference string 100r and the defective string 110f in FIG. 1. In the present embodiment, the output current If is measured while setting the light shielding plate 114 at the module 110 in the defective string 110f so as to form the constructive defective state at the entire module 110 as described above. Then, the change in the output current If is observed while sequentially moving the light shielding plate 114, so that the presence or absence of the defect, that is, the presence or absence of the defective cluster 111f and the number of the defective clusters are estimated.

In practical measurement, it is difficult in some cases to correctly calculate the number of the defective clusters 111f from only the change in the output current If in the defective string 110f because of the error of change in environment such as a solar radiation amount or a temperature for each measurement or during measurement.

Accordingly, the present embodiment is provided with the reference string 100r by which the number of the defective clusters 111f can be definitely recognized so as to be used as criteria/reference in the calculation for the number of the defective clusters 111f (the number of the defective clusters 111f in each defective module 100f and the total number of the defective clusters 111f in the entire defective string 100). As described above, the reference string 100r is a normal string 100 (that has not been identified as the defective string 100f), and it is assumed that the total number of the defective clusters 111f in the entire module 110 included in the reference string 100r is zero. Therefore, when the light shielding plate 114 is set at any one of the modules 110 as illustrated, the module 110 in the present embodiment has three clusters 111, and therefore, it is definite that the total number of the defective clusters 111f at which the constructive defective state has been formed by the setting of the light shielding plate 114 is "three".

Therefore, the output current "Ir" of the reference string 100r is used as the criteria in the observation of the change in the output current If of the defective string 110f, so that accuracy for the calculation for the number of the defective clusters 111f and the total number can be improved. At this time, in order to suppress the errors caused by the change in the environment such as the solar radiation amount and the temperature during the measurement, it is desirable to measure the output current "Ir" of the reference string 100r and the output current "If" of the defective string 110f at the same timing (also including a case of periods of time that are as close as possible). And, in order to reduce differences at the same timing in the solar radiation amount, the temperature, and others between the reference string 100r and the defective string 110f, it is desirable to set the reference string 100r and the defective string 110f so as to be as close as possible.

FIG. 4(b) is a graph illustrating a change state of each of the output currents "Ir" and "If" in a case of no setting of the light shielding plate 114 at the defective string 110f and cases of setting of the light shielding plate 114 so as to sequentially move over the modules 110 (fourteen modules 110 that are denoted with (1) to (14) in the example of FIG. 4) under a condition in which the light shielding plate 114 is set at any module 110 in the reference string 100r as illustrated in FIG. 4(a). Here, note that this drawing schematically illustrates an ideal state without consideration of the measurement errors or others due to noises, the change in the environment such as the solar radiation amount and the temperature caused in practical measurement.

The output current Ir of the reference string 100r is measured while the light shielding plate 114 is set at any normal module 110, and therefore, ideally has a constant value obtained by reducing an amount corresponding to the number ("three" in the present embodiment) of the defective clusters 111f, at which the constructive defective state is newly formed by the light shielding plate 114, from a value in the case of no setting of the light shielding plate 114.

On the other hand, in the state of no setting of the light shielding plate 114 (illustrated on a left end of the graph), the output current If of the defective string 100f has a value obtained by reducing an amount corresponding to the total number of the defective clusters 111f in the entire defective string 100f from a value that can be obtained in the non-defective case. In the cases of sequentially setting the light shielding plate 114 at each module 110 (including the defective module 100f), the output current has a value obtained by further reducing an amount corresponding to the number of the defective clusters 111f, at which the constructive defective state is newly formed by setting the light shielding plate 114 at this module, from the value.

That is, in a case of setting of the light shieling plate 114 at, for example, the normal module 110 denoted with (1) or others not having the defective cluster 111f, the output current If has a value obtained by reducing an amount corresponding to the three defective clusters 111f. Meanwhile, in a case of setting of the light shieling plate 114 at, for example, the defective module 110f denoted with (4) or others, the output current has a value obtained by reducing an amount corresponding to a really-existing defective cluster 111f in this defective module 100f, and besides, an amount corresponding to the defective cluster 111f, at which the constructive defective state is newly formed.

Therefore, a reduction amount of the output current If in the case of setting of the light shielding plate 114 at the defective module 100f is smaller than that in the case of setting of the light shielding plate 114 at the normal module 110 (this means that the value of the output current If is larger). And, based on the value (or the change amount) of this output current If, it can be estimated whether the defective cluster 111f exists in the defective module 100f or not.

Further, through a method described later in the present embodiment, the total number of the defective clusters 111f in the defective string 190f and the number of the defective clusters existing in each defective module 110f can be also estimated by using, as the criteria, the output current Ir of the reference string 100r in which the number of the defective clusters 111f is definite.

FIG. 4(c) is a bar graph illustrating states of the estimated number of the defective clusters 111f (the estimated defective number) in each of the fourteen modules 110 denoted with (1) to (14) and the estimated total number of the defective clusters 111f (the estimated total defective member) in the entire defective string 110f. For example, as illustrated in FIG. 4(b), in the module 110 denoted with (1) or others, the reduction amount of the output current If is large, and the value of the output current is small, and therefore, the estimated number of the defective clusters 111f to be calculated is small. On the other hand, in the defective module 110 denoted with (4) or others, the reduction amount of the output current If is small, and the value of the output current is large, and therefore, the estimated number of the defective clusters 111f to be calculated is large.

In the present embodiment, in order to identify the defective module 110f, preferentially perform the inspection and the diagnosis for the defect of this module, and eliminate the practical inspection for a module 110 having a low defective possibility or others, modules 110 are sequentially selected as the inspection target in an order from a module 110 having the larger estimated number of the defective clusters 111f (having a larger possibility of the defective module 110f). Then, the estimated numbers of the defective clusters 111f in the selected respective modules 110 are accumulated and summed up, and only the modules 110 selected up to a moment when a value of the accumulated numbers exceeds the estimated total defective number are separately inspected for supporting the defective possibility or others. In this manner, unnecessary inspection works can be eliminated, and effective and reliable inspection can be performed.

Figure 5:
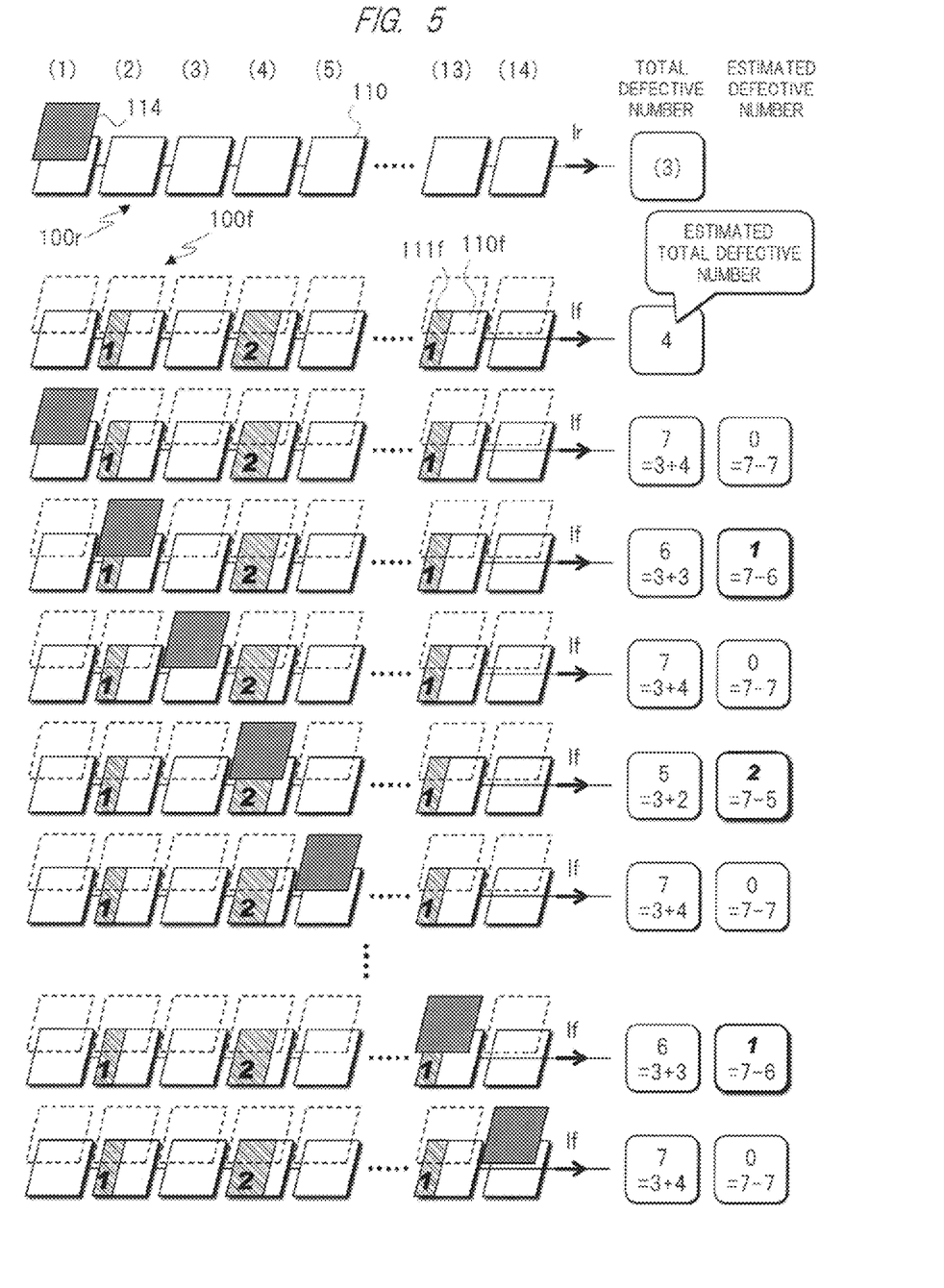
FIG. 5 is a diagram illustrating an outline of an example of a method of calculating the number of defective clusters according to one embodiment of the present invention.

FIG. 5 is a diagram illustrating an outline of an example of a method of calculating the number of the defective clusters 111f according to the present, embodiment. The top drawing illustrates a state of measurement of the output current Ir in the reference string 100r to be the reference, and each lower drawing illustrates a state of measurement of the output current If performed while the light shielding plate 114 is sequentially set sit the inspection-target defective string 110f.

The output currents Ir and If are measured in the state of setting of the light shielding plate 114 at any module 110 (the module 110 denoted with (1) in the example of FIG. 5) in the reference string 100r first, and besides, the state of no setting of the light shielding plate 114 at the inspection-target defective string 100f (illustrated in the defective string 110f in the top drawing). It is definite that the total number of the defective clusters 111f (the total defective number) in the reference string 100r is three that is the number in the constructive defective state formed by using the light shielding plate 114, and therefore, the output current Ir under this circumstance can be used as the criteria value for calculating and estimating the number of the defective clusters 111f.

Meanwhile, regarding the defective string 110f, the total defective number in the entire defective string 110f is calculated based on the measured output, current If and the output current Ir becoming the criteria value. In the state of no setting of the light-shielding plate 114, the number is the number of the really-existing defective clusters 111f, and therefore, a value of this number is set to the estimated total defective number. The example of FIG. 5 shows a case with four defective clusters 111f in total that are one defective cluster in the module 110 denoted with (2), two defective clusters in the module 110 denoted with (4), and one defective cluster in the module 110 denoted with (13), which results in the calculated estimated total defective number of "four" (at this stage, as details, it is indefinite which module 110 has defective clusters 111f, and indefinite how many defective clusters 111f exists in this module 110).

Then, the output current If is measured in each state of sequential setting of the light shielding plate 114 at each of the modules 110 denoted with (1) to (14) in the defective string 100*f*, and the total defective number in the entire defective string 110*f* is calculated based on the output current If measured in each state and the output current Ir becoming the criteria value. For convenience of description, note that the example of FIG. 5 is assumed so that the total defective number is calculated as a logical value from practically-measured values.

In a state of setting of the light shielding plate 114 at the module 110 denoted with (1), three defective clusters 111*f* at which the constructive defective state is newly formed by using the light shielding plate 114 are added to the four defective clusters 111*f* in total existing in the respective modules 110 denoted with (2), (4), and (13), and therefore, the total defective number is calculated as expressed in "3+4=7". At this time, the estimated number of the defective clusters 111*f* (the estimated defective number) in the module 110 denoted with (1) is a value obtained by subtracting "7" that is the number calculated as the total defective number at this time from "7" that is sum of the total defective number in the reference string 100*r*, i.e., "3" that is the number of the defective clusters 111*f* at which the constructive defective state is newly formed by setting the light shielding plate 114 at the normal module 110 and "4" that is the number calculated as the estimated total defective number in the defective string 110*f*. That is, the a relation of "7−7=0" is established, and therefore, the estimated defective number in the module 110 denoted with (1) is "0".

Next, in a state of setting of the light shielding plate 114 at the module 110 denoted with (2) (that is the defective module 100*f*), three defective clusters 111*f* at which the constructive defective state is formed by using the light, shielding plate 114 are added to the three defective clusters 111*f* in total existing in the respective modules 110 denoted with (4) and (13), and therefore, the total defective number is calculated as expressed in "3+3=6". That is, one defective cluster 111*f* originally included in the defective module 110*f* denoted with (2) is absorbed into the constructive defective state formed by using the light shielding plate 114. At this time, the estimated defective number in the defective module 100*f* denoted with (2) is expressed as "7−6=1" that is obtained by subtracting "6" that is the total defective number calculated at this time from "7" that is sum of "3" of the total defective number in the reference string 100*r* and "4" of the estimated total defective number in the defective string 110*f*.

Subsequently, by the same process to the respective modules denoted with (3) to (14), the estimated defective number of each module 110 can be calculated as illustrated. It is basically estimated that the module 110 whose estimated defective number is "one" or larger is the defective module 100*f* having one or more defective clusters 111*f*. Note that each value of the total defective number, the estimated total defective number, the estimated defective number and others shown in FIG. 5 is obtained under such ideal circumstances as measuring a logical value as described above. Therefore, in practical inspection, each of the above-described values is not always an integer value as shown.

In the present embodiment, when the estimated defective number (the number of the defective clusters 111*f*) in each module 110 is calculated by using the method as described above, the module 110 that is practically preferentially inspected for supporting the defective possibility or others is selected and extracted in an order from the module having the larger estimated defective number until the summed value of the estimated defective numbers exceeds the estimated total defective number as illustrated in FIG. 4 described above. Note that there is practically a case of very small difference in the estimated defective number calculated in each module 110 among a plurality of modules 110, which may result in influence on a preferential order in the selection of the inspection target. Therefore, in the present embodiment, the preferential order is determined in consideration of results of the automatic or manual check in each module 110 for whether the heat-generated portion (hot spot) exists or not, for the heat generation state and others based on the image-capturing data captured by the infrared-ray camera 40 as described above.

<Process Flow>

Figure 6:
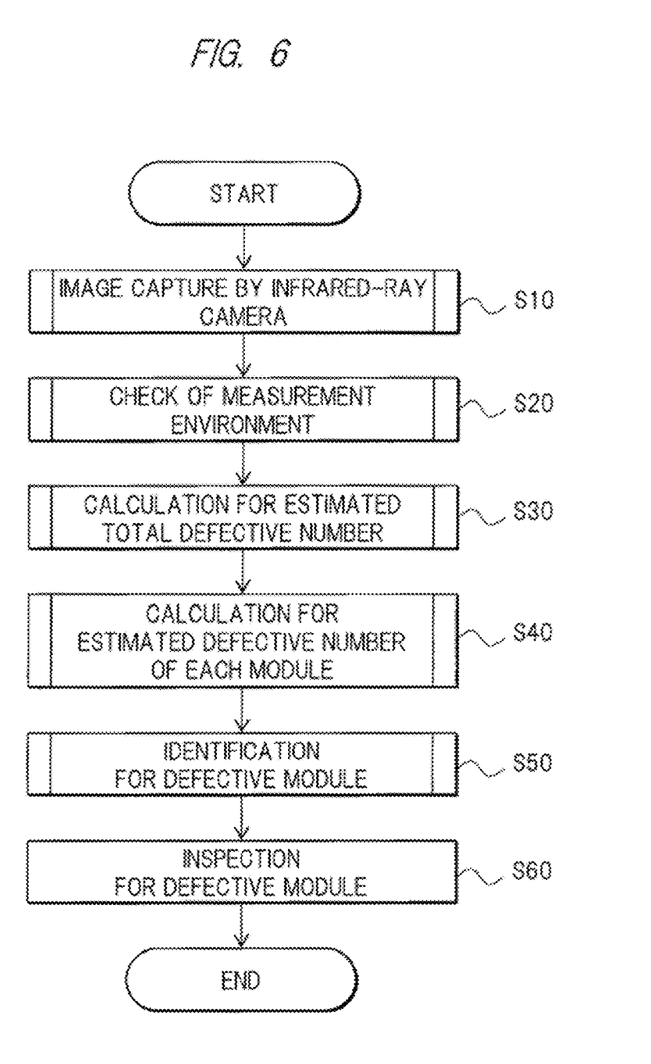
FIG. 6 is a flowchart illustrating an outline of an example of a process flow of an inspection method in the photovoltaic power generation system according to one embodiment of the present invention.

FIG. 6 is a flowchart illustrating an outline of an example of a process flow of a method of inspecting the photovoltaic power generation system according to the present embodiment. As preparation for the process start, it is assumed that the defective string 100*f* to be the inspection target and the reference string 100*r* have been already identified. First, as previous preparation, it is checked whether the hot spot exists or not by capturing an image of each module 110 in the defective string 110*f* by using the infrared-ray camera 40 (S10). Although the description of the detailed process contents is omitted, it is checked whether the hot spot exists or not by, for example, manually or automatically capturing each image of front and back surf aces of each module 110 by using the infrared-ray camera 40, analyzing the image-capturing data by using the high-order system 50, and calculating a temperature of each portion. The information indicating whether the hot spot exists or not is stored in the high-order system 50.

Figure 7:
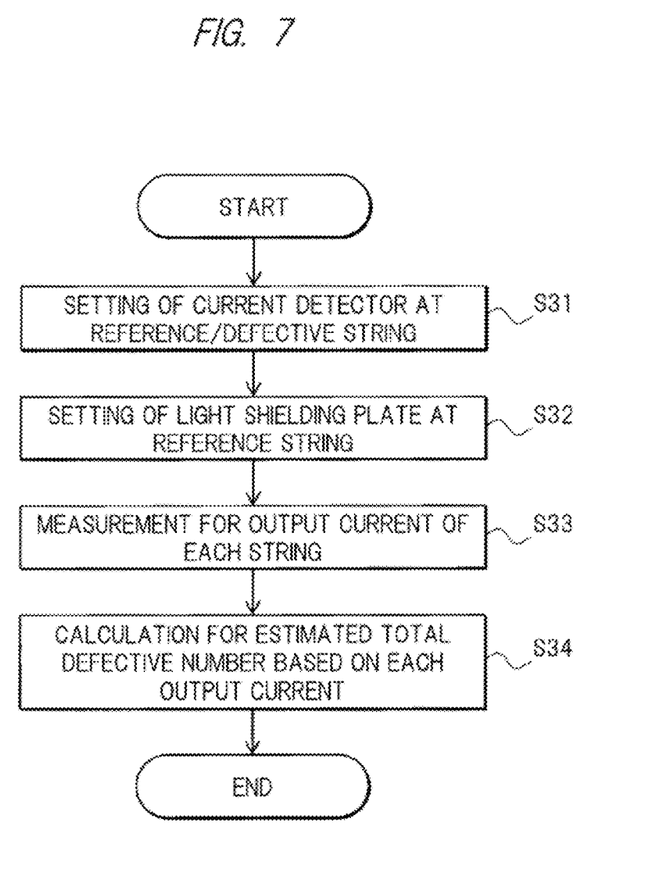
FIG. 7 is a flowchart illustrating an outline of an example of a flow of a process of calculating an estimated total defective number according to one embodiment of the present invention.

Next, a process of checking the measurement environment such as a state of a current detector 31 that measures the output currents and a solar radiation amount is performed (S20). Although the description of the detailed process contents is omitted, for example, both of two current detectors 31 connected to the PV unit 30 are set at the reference string 100*r* to measure the output currents Ir at them, and difference (that is ideally zero) between the output currents is obtained. The high-order system 50 checks the states of the current detectors 31 in accordance with a value of this difference. And, in accordance with the value of this difference, calibration for determining a correction amount for a measurement result of each current detector 31 may be performed. Further, the solar radiation amount may be calculated from the output current Ir by using a publicly-known calculation method, and, if the amount is equal to or smaller than a predetermined threshold, the amount may be regarded as being an insufficient solar radiation amounts and the inspection may be stopped. Note that an accuracy of each value of the output currents obtained by the current detectors 31 may be increased by, for example, using an average value of the data or others obtained by performing the sampling a plurality of times. Then, as practical inspection, first, the estimated total defective number that is the total number of the really-existing defective clusters 111*f* in the entire defective string 110*f* is calculated as illustrated in FIG. 4 (S30). FIG. 7 is a flowchart illustrating an outline of a flow example of an estimated total defective number calculation process (S30) according to the present embodiment. First, the two current detectors 31 connected, to the PV unit 30 are set at the reference string 100*r* and the defective string 110*f*, respectively (S31). And, in a state of setting of the light shielding plate 114 at only any module 110 of the reference string 100*r* (S32), the output current Ir of the reference string 100*r* and the output current If of the defective string 110*f* are measured at the same timing (S33).

Then, the estimated total defective number in the entire defective string 110*f* is calculated based on the measured output currents Ir and If by the high-order system 50 (S34). Although the descriptions of the detailed calculation method and calculation formula are omitted, for example, a coupling constant (diode performance index) in the module 110, a parameter related to a reverse saturation current, and others are adjusted first based on specification values of the module 110 under standard conditions (temperature T=25° C., solar radiation amount=1), and then, the parameter of the reverse saturation current at the temperature T is adjusted. And, the operational voltage illustrated in FIG. 3 is estimated by using a publicly-known calculation formula based on each adjusted parameter, the measurement environmental data (temperature T), and the measurement data (the output current Ir of the reference string 100r).

And, the estimated total defective number is calculated based on each parameter, the measurement environmental data (temperature T), the measurement data (the output current If of the defective string 110f) and the operational voltage value estimated above. Specifically, for example, an initial value of the estimated total defective number is set to zero based on each parameter adjusted above, the temperature T, and the output current If, and then, the operational voltage is estimated by using the publicly-known calculation formula that is the same as above. Then, the estimation for the operational voltage is repeated while the value of the estimated total defective number is sequentially incremented by a predetermined value (for example, 0.1 or others), that is, while the number of the normally-operating clusters 111 is sequentially decremented by a predetermined value, and then, a value is set to the estimated total defective number at a moment when the estimated value is equal to or smaller than the above-described operational voltage calculated based on the output current Ir of the reference string 100r.

Figure 8:
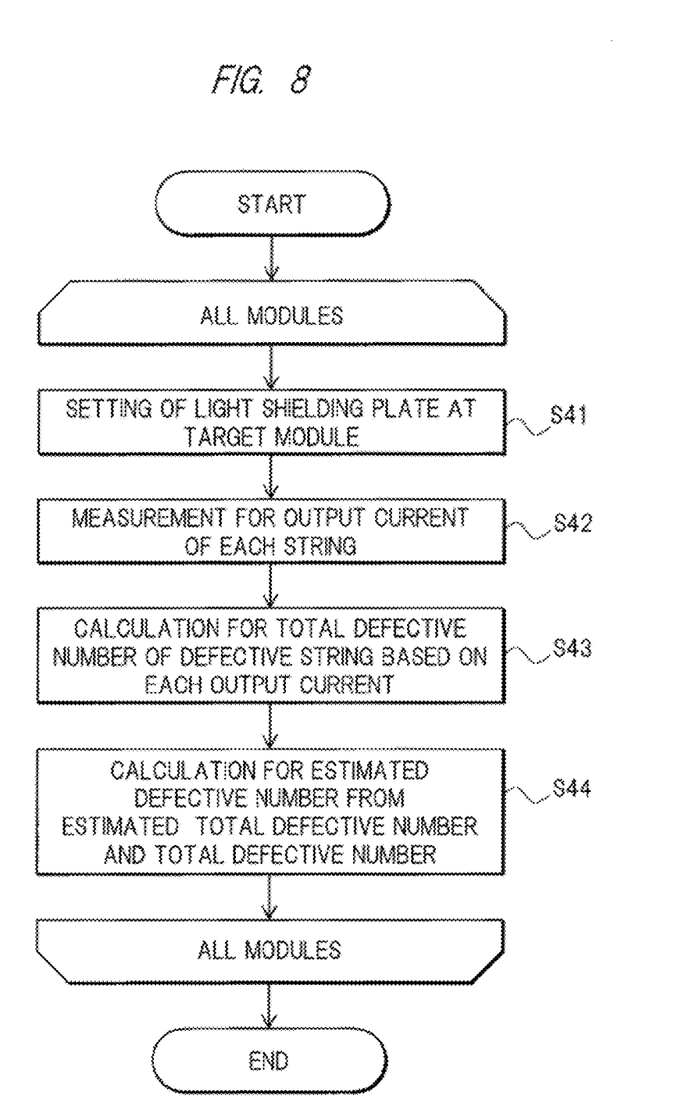
FIG. 8 is a flowchart illustrating an outline of an example of a flow of a process of calculating a total defective number in a constructive defective state according to one embodiment of the present invention.

The process returns to FIG. 6, and then, the number of the defective clusters 111f (the estimated defective number) in each module 110 of the defective string 110f is calculated (S40). FIG. 8 is a flowchart illustrating an outline of a flow example of an estimated defective number calculation process (S40) in each module 110 according to the present embodiment. Here, a loop process is performed, the loop process repeating a process to all modules 110 (fourteen modules denoted with (1) to (14) in the present embodiment) included in the defective string 110f.

In the loop process, first, in a state of forming the constructive defective state by setting the light shielding plate 114 at a process-target module 110 (S41), the output current Ir of the reference string 100r and the output current If of the defective string 110f are measured at the same timing (S42). Then, by the high-order system 50, the total number of the defective clusters 111f (the total defective member) in the defective string 110f in the state of the formation of the constructive defective at the process-target module 110 is calculated based on the measured output currents Ir and If (S43).

Although the descriptions of the detailed calculation method and calculation formula in the step S43 are omitted, they are basically the same as those in the process in the step S34 in the example of FIG. 7, and, for example, each parameter in the module 110 and others are adjusted first based on specification values of the module 110 under standard conditions, and the operational voltage illustrated in FIG. 3 is estimated by using a publicly-known calculation formula based on each adjusted parameter, the measurement environmental data (temperature T), and the measurement data (the output current Ir of the reference string 100r).

And, the total defective number is calculated based on each parameter, the measurement environmental data (temperature T), the measurement data (the output current If of the defective string 110f) and the operational voltage value estimated above. Specifically, for example, an initial value of the total defective number is set to zero based on each parameter adjusted above, the temperature T, and the output current If, and then, the operational voltage is estimated by using the publicly-known calculation formula that is the same as above. Then, the estimation for the operational voltage is repeated while the value of the total defective number is sequentially incremented by a predetermined value (for example, 0.1 or others), that is, while the number of the normally-operating clusters 111 is sequentially decremented by a predetermined value, and then, a value is set to the total defective number at a moment when the estimated value is equal to or smaller than the above-described operational voltage calculated based on the output current Ir of the reference string 100r.

Next, the number of the defective clusters 111f (the estimated defective number) in the process-target module 110 is calculated (S44) by using the values of the estimated total defective number of the defective strings 110f calculated in the step S30, the total defective number of the defective strings 100f in the defective constructive state calculated in the step S43, and the total defective number of the reference strings 100r. Specifically, as illustrated in, for example, the example of FIG. 5, the estimated defective number in the process-target module 110 is calculated by subtracting the value of the total defective number of the defective string 110f calculated in the defective constructive state from the sum of the total defective number of the reference string 100r and the estimated total defective number of the defective string 100f. At this time, an adjustment process may be performed so as to weigh the estimated defective number by adding or multiplying a predetermined coefficient or others obtained based on the fact in the step S10 checking whether the hot spot exists or not.

Note that the measurement data and the calculated data such as the estimated defective number are stored so as to be identifiable for each position of the modules 110 at which the light shielding plate 114 is set. Then, in the loop process, the process proceeds to a process for a next module 110. Note that the example illustrated in FIG. 5 shows the case of sequential setting of the light shielding plate 114 at the modules 110 denoted with (1) to (14) so as to move to the adjacent module. However, a setting order of the light shielding plate 114 is not always based on the sequential movement to the adjacent module 110.

When the process is sequentially performed to each module 110 of the defective string 110f, the measurement, environment such as the solar radiation amount and the temperature practically changes during the sequential process, which may result in change in the output current. On the other hand, by calculating the estimated defective number while using the output current Ir of the reference string 100r obtained at the same timing as the reference as described above in the process flow, the change in the output current can be normalized.

The process returns to FIG. 6 to identify the defective module 100f (S50) by using the high-order system 50 based on the estimated total defective number of each module 110 calculated in the step S40. Specifically, for example, the modules 110 are sorted in a descending order from a module 110 having a larger estimated defective number, and modules 110 that are positioned at the sorted orders until total of the estimated defective numbers counted from a top sorted order exceeds the estimated total defective number are extracted and are identified as candidates for the defective modules 100f.

Then, the inspection for supporting the defective possibility is performed (S60) to the defective modules 100f that have been identified and sorted in the step S50 in an order from a higher, sorted order. For example, an "I-V curve" is obtained by practically and sequentially measuring the output current and voltage of each of the target modules 110, and it is determined whether the defect exists or not based on the I-V curve. In this manner, the inspection to a module 110 having a low defective possibility can be eliminated, and the inspection can be effectively performed in an order from a module having a higher defective possibility.

As described above, in the photovoltaic power generation inspection system according to one embodiment of the present invention, the defective module 110f can be identified without disconnection from the modules 110 included in the previously-identified defective string 110f. That is, the presence or absence of the defective cluster 111f included in the defective module 110f and the number of the defective clusters are estimated by measuring the output current If while, the light shieling plate 114 is set at each module 110 in the defective string 110f, and besides, by observing the change in the output current If obtained when the light shielding plate 114 sequentially moves to another module 110.

At this time, the determinate constructive defective state is formed at the reference string 100r by using the light shielding plate 114, so that a standard value (a change amount of the output current) can be obtained, the standard value being used for estimating the number of the defective clusters 111f included in the defective module 110f and the total number of the defective clusters in the entire defective string 110f. And, the output current Ir of the reference string 100r and the output current If of the defective string 100f are measured at the same timing, and the number of the defective clusters 111f is calculated and normalized based on these output currents, so that the influence of the change in the environment such as the solar radiation amount and the temperature due to the difference in the measurement timing can be eliminated. In these manners, accuracy of the identification for the defective module 100f can be improved, and efficiency in the practical inspection to each module 110 can be significantly improved.

In the foregoing, the invention made by the present inventors has been concretely described based on the embodiments. However, it is needless to say that the present invention is not limited to the foregoing embodiments and various modifications and alterations can be made within the scope of the present invention. For example, the above-described embodiments have been explained in detail for easily understanding the present invention, but are not always limited to the one including all structures explained above. Also, another structure can be added to/eliminated from/replaced with a part of the structure of the above-described embodiments.

And, a part or entire of each, structure, function, process unit, process means described above and others may be achieved by, for example, a hardware obtained by designing in an integrated circuit or others. Further, each structure, function described above and others may be achieved by a software obtained by interpreting and executing a program for achieving each function by a processor. The information of a program, a table, a file and others for achieving each function can be placed in a recording device such as a memory, a hard disk, and a SSD (Solid State Drive), or a recording medium such as an IC card, a SD card, and a DVD.

INDUSTRIAL APPLICABILITY

The present invention can be utilized for a photovoltaic power generation inspection system and a photovoltaic power generation inspection method for detecting a defect of a photovoltaic cell module.

EXPLANATION OF REFERENCE CHARACTERS

1 . . . photovoltaic power generation inspection system, 10 . . . array, 20 . . . connection box, 30 . . . PV unit, 31 . . . current detector, 40 . . . infrared-ray camera, 100 . . . string, 100r . . . reference string, 100f . . . defective string, 110 . . . module, 110s . . . Si-based module, 110c . . . CIS-based module, 110f . . . defective module, 111 . . . cluster, 111f . . . defective cluster, 112 . . . cell, 112f . . . , defective cell, 113 . . . BPD, 114 . . . light shielding plate

The invention claimed is:

1. A photovoltaic power generation inspection system in a photovoltaic power generation system having a structure in which a plurality of photovoltaic cell strings each formed of a plurality of series-connected photovoltaic cell modules are connected in parallel, the photovoltaic power generation inspection system detecting a defective module that is a photovoltaic cell module having a defect among a plurality of photovoltaic cell modules included in a defective string that is a photovoltaic cell string identified as having a defect, the photovoltaic power generation inspection system comprising:
 a current detector that measures an output current of a photovoltaic cell string without disconnection; and
 a monitor unit that estimates one or more defective modules based on change in a plurality of first output currents each measured by the current detector while photovoltaic cell modules included in the defective string are sequentially shielded from light by a light shielding member.

2. The photovoltaic power generation inspection system according to claim 1,
 wherein the photovoltaic cell module includes a predetermined number of clusters to be a unit of the defect, the predetermined number being one or larger,
 the current detector measures a second output current of a predetermined reference string, that has been identified as not having the defect, among photovoltaic cell strings at the same timing as a timing of measurement for each of the first output currents of the defective string while any one of photovoltaic cell modules included in the reference string is shielded from light by the light shielding member, and
 the monitor unit calculates each of second numbers that are the total number of defective clusters in the defective string based on each of the first output currents while using the second output current as criteria corresponding to a first number that is the number of clusters at which a constructive defective state is formed by the light shielding member, and estimates whether or not the defect exists in a photovoltaic cell module that is shielded from light by the light shielding member when the corresponding first output current is measured based on change in the second numbers.

3. The photovoltaic power generation inspection system according to claim 2,
wherein the monitor unit calculates a third number that is the total number of defective clusters included in the defective string based on the first output current that has been measured while all photovoltaic cell modules included in the defective string are not shielded from light by the light shielding member, and estimates a fourth number as the number of defective clusters in a photovoltaic cell module shielded from light by the light shielding member when the first output current corresponding to the second number that is a target is measured, the fourth number being obtained by subtracting each of the second numbers from a sum of the first number and the third number.

4. The photovoltaic power generation inspection system according to claim 3,
wherein the monitor unit extracts photovoltaic cell modules included in the defective string in an order from a corresponding photovoltaic cell module having a larger fourth number until total of the fourth numbers exceeds the third number, and outputs the extracted photovoltaic cell modules as candidates for the defective module.

5. The photovoltaic power generation inspection system according to claim 3, further comprising
an infrared-ray camera,
wherein the monitor unit obtains image-capturing data by capturing an image of a front and/or a back surface of each photovoltaic cell module included in the defective string by using the infrared-ray camera, and adjusts the fourth number in a target photovoltaic cell module based on an analysis result of the image-capturing data.

6. The photovoltaic power generation inspection system according to claim 1, wherein the light shielding member shields at least one or more cells in a photovoltaic cell module that is a light-shielded target from light.

7. The photovoltaic power generation inspection system according to claim 1, wherein the current detector measures an output current of a photovoltaic cell string by using a contactless current sensor.

8. A photovoltaic power generation inspection method in a photovoltaic power generation system having a structure in which a plurality of photovoltaic cell strings each formed of a plurality of series-connected photovoltaic cell modules are connected in parallel, the photovoltaic power generation inspection method detecting a defective module that is a photovoltaic cell module having a defect among a plurality of photovoltaic cell modules included in a defective string that is a photovoltaic cell string identified as having a defect, the photovoltaic power generation inspection method comprising:
a first step of measuring each of first output currents of the defective string without disconnection while photovoltaic cell modules included in the defective string are sequentially shielded from light by a light shielding member; and
a second step of estimating one or more defective modules based on change in the plurality of measured first output currents.

9. The photovoltaic power generation inspection method according to claim 8,
wherein a photovoltaic cell module includes a predetermined number of clusters to be a unit of a defect, the predetermined number being one or larger,
the method further comprising:
a third step of measuring a second output current of a predetermined reference string, that has been identified as not having the defect, among photovoltaic cell strings at the same timing as a timing of measurement for each of the first output currents of the defective string in the first step while any one of photovoltaic cell modules included in the reference string is shielded from light by the light shielding member,
wherein, in the second step, a second number that is the total number of defective clusters in the defective string is calculated based on each of the first output currents while using the second output current as criteria corresponding to a first number that is the number of clusters at which a conductive defective state is formed by the light shielding member, and it is estimated whether or not a defect exists in a photovoltaic cell module shielded from light by the light shielding member when the corresponding first output current is measured.

10. The photovoltaic power generation inspection method according to claim 9, further comprising
a fourth step of measuring the first output current while all photovoltaic cell modules included in the defective string are not shielded from light by the light shielding member,
wherein, in the second step, a third number that is the total number of defective clusters included in the defective string is calculated based on the first output current measured in the fourth step, and a fourth number obtained by subtracting each of the second numbers from a sum of the first number and the third number is estimated as the number of defective clusters in a photovoltaic cell module shielded from light by the light shielding member when the first output current corresponding to the second number that is a target is measured.

* * * * *